United States Patent [19]

Uemura et al.

[11] Patent Number: 5,093,156
[45] Date of Patent: Mar. 3, 1992

[54] PROCESS FOR PREPARING CARBON MATERIAL

[75] Inventors: Seiichi Uemura, Ota; Yoshio Sohda, Machida; Yasuji Ido, Yokohama; Yukinori Kude, Yokohama; Takefumi Kohno, Yokohama; Toshio Hirai, Sendai; Makoto Sasaki, Sendai; Masayuki Niino, Sendai, all of Japan

[73] Assignees: Nippon Oil Company, Limited, Tokyo, Japan; Japan as represented by Director-General, National Aerospace Laboratory

[21] Appl. No.: 558,703

[22] Filed: Jul. 26, 1990

[30] Foreign Application Priority Data

Jul. 27, 1989 [JP] Japan ................................. 1-192591

[51] Int. Cl.$^5$ ........................ C23C 16/00; B05D 1/36
[52] U.S. Cl. .................................. 427/249; 427/248.1; 427/255.7; 427/419.7; 427/419.1
[58] Field of Search .................. 427/249, 248.1, 255.7, 427/419.7, 419.1; 428/368

[56] References Cited

U.S. PATENT DOCUMENTS

| 4,397,901 | 8/1983 | Warren | 428/101 |
| 4,405,685 | 9/1983 | Honjo et al. | 428/368 |
| 4,766,013 | 8/1988 | Warren | 427/228 |

FOREIGN PATENT DOCUMENTS 01-79071  3/1989  Japan.

Primary Examiner—Shrive Beck
Assistant Examiner—Roy V. King
Attorney, Agent, or Firm—Scully, Scott, Murphy & Presser

[57] ABSTRACT

A carbon material having oxidation resistance is prepared by forming a first coating constituted mainly by carbon on the surface of a carbon/carbon composite by chemical vapor deposition, then forming on said first coating a second coating of a ceramic or both a ceramic and carbon by chemical vapor deposition, and changing at least one of thermal physical properties or mechanical physical properties of carbon in said first coating continuously or step-wise.

6 Claims, No Drawings

PROCESS FOR PREPARING CARBON MATERIAL

BACKGROUND OF THE INVENTION

The present invention relates to a process for preparing a carbon material oxidation resistance.

A carbon/carbon composite is a material capable of retaining high strength and high elastic modules even at high tempertures higher than 1,000° C. in an inert atmosphere, and having a small thermal expansion coefficient. Its application to components of aeronautic and sapce machinery and devices, brake material and furnace material is expected. In air, however, it is oxidized and wasted at a temperature of about 500° C. or higher.

There has been made an attempt of coating the surface of a carbon/carbon composite with a ceramic material to improve the oxidation resistance of the composite. But since the thermal expansion of the carbon/carbon composite as base material and that of the ceramic material are different from each other, there occurs delamination at the interface or cracking of the coating, so the function of the composite is not exhibited to a satisfactory extent.

Having made studies about a process for improving the oxidation resistance of a carbon/carbon composite, the present inventors found out and already proposed a process for preparing a carbon/carbon composite having oxidation resistance. According to this previously-o proposed process, there is used a carbon/carbon composite comprising 10-70 vol % of carbon fibers and 5-90 vol % of a carbonaceous matrix and having an open voids content of 10-55%, and carbon and/or a ceramic material are(is) deposited and filled into the open voids of the carbon/carbon composite by vapor phase decomposition, then the surface of this deposit is coated with a ceramic material or both a ceramic material and carbon by vapor phase decomposition.

It is the object of the present invention to provide a carbon/carbon composite having superior oxidation resistance.

SUMMARY OF THE INVENTION

The present invention resides in a process for preparing a carbon material, characterized by forming a first coating constituted mainly by carbon on the surface of a carbon/carbon composite by vapor phase decomposition, then forming thereon a second coating of a ceramic material or both a ceramic material and carbon by chemical vapor phase deposition, and changing at least one of thermal physical properties or mechanical physical properties of carbon in the said first coating continuously or step-wise.

DETAILED DESCRIPTION OF THE INVENTION

The present invention will be described in detail hereinunder.

The carbon/carbon composite used as a base of the carbon material of the present invention indicates a material comprising carbon fibers and a carbon matrix, in which the proportion of the carbon fibers is usually in the range of 10 to 70 vol %, preferably 20 to 0 vol %.

Examples of the carbon fibers which constitute the above carbon/carbon composite include various carbon fibers such as, for example, pitch-, polyacrylonitrile-and rayon-based carbon fibers. Particularly, pitch-based carbon fibers are easy to enhance oxidation resistance and so are suitable.

The carbon fibers are used usually as a bundle of 500 to 25,000 fibers. Two- or three-dimensional formed products obtained using carbon fibers such as unidirectional laminates, two-dimensional fabrics or laminates thereof, three-dimensional fabrics, and products formed in the shape of mat or felt, are also employable, with three-dimensional fabrics being particularly preferred.

As examples of the carbon matrix there are mentioned those obtained by the carbonization of carbonaceous pitches, phenolic resins, or furan resins and those obtained by chemical vapor deposition of hydrocarbons. Particularly, those obtained by the carbonization of carbonaceous pitches are preferred.

As the carbonaceous pitches referred to above there may be used both coal- and petroleum-based pitches. Particularly, those ranging in softening point from 100° to 400° C., preferably 150° to 350° C., are preferred. Further, as such carbonaceous pitches there may be used optically isotropic or anisotropic pitches each alone or in combination. Particularly, it is desirable to use an optically anisotropic pitch having an optically anisotropic phase content of 60-100%, more preferably 80-100%.

How to prepare the carbon/carbon composite used as a base in the present invention is not specially limited. There may be used a suitable conventional method. For example, the carbon/carbon composite is obtained by impregnating a carbon fiber fabric or preform with a carbonaceous pitch, a phenolic resin, or a furan resin, followed by carbonization under atmospheric pressure or under elevated pressure or hot pressing. The impregnation is attained by heat-melting a carbonaceous pitch for example under vacuum.

The carbonization under atmospheric pressure may be carried out at 400-2,000° C. in an inert gas atmosphere. The carbonization under elevated pressure may be conducted at 400-2,000° C. under isotropic pressurization to 50-10,000 kg/cm$^2$ using an inert gas. Further, the 2,000° C. under uniaxial pressing at 10-500 kg/cm$^2$ using a hot press for example.

Also, an HIP (hot isostatic pressing) apparatus may be used for the carbonization. Pressing and heat treatment in the HIP apparatus may be carried out by the application of pressure to 50-10,000 kg/cm$^2$, preferably 200-2,000 kg/cm$^2$, using an inert gas, at a temperature of 100° to 3,000° C., preferably 400° to 2,000° C. As a pressure medium gas there may be used such an inert gas as argon, nitrogen, or helium, carbonization or graphitization under atmospheric pressure which follows the carbonization under the application of pressure may be conducted at 400-3,000° C. in an inert gas atmosphere.

According to the present invention, a first coating constituted mainly by carbon is formed by a vapor phase decomposition method on the surface of the carbon/carbon composite prepared in the above manner, and in the said first coating at least one of thermal properties or mechanical physical properties of carbon is changed continuously or step-wise.

The thermal properties referred to above indicate coefficient of thermal expansion and thermal conductivity, and changing at least one of the thermal physical properties preferably means changing a coefficient. of thermal expansion.

In this connection, it is preferred that the coefficient of thermal expansion of carbon in the first coating portion near the surface of the carbon/carbon composite, that is, the thermal expansion coefficient of carbon in the innermost layer portion of the first coating, be smaller than that of the first coating portion near the second coating, that is, the outermost layer portion of the first coating. More concretely, it is desirable that the coefficient of thermal expansion of carbon become larger continuously or step-wise from the innermost to the outermost layer of the first coating.

The above mechanical properties indicate Young's modulus, strength and elongation at failure, and changing at least one of mechanical properties preferably means changing Young's modulus. In this case, it is preferred that the Young's modulus of carbon in the first coating portion near the surface of the carbon/carbon composite, that is, the Young's modulus of carbon in the innermost layer of the first coating, be larger than that of carbon in the first coating portion near the second coating, that is, the outermost layer portion of the first coating. More concretely, it is desirable that the Young's modulus of carbon become smaller continuously or step-wise from the inner most to the outermost layer of the first coating. It is also desirable that a smaller Young's modulus middle layer is present.

Changing at least one of the thermal properties or mechanical properties in the first coating formed of carbon, as mentioned above, can be attained by changing the structure or the texture of the thermally decomposed carbon. The structure of the thermally decomposed carbon as referred to herein indicates a crystal level structure capable of being discriminated, for example, by X-ray diffraction, a high resolution electron microscope, or Laser Raman spectrum. The texture of the thermally decomposed carbon as referred to herein indicates a fine texture or of preferred orientation capable of being discriminated using, for example, an optical microscope or a scanning electron microscope.

How to form the first coating used in the present invention will now be described in detail. The first coating is formed by a chemical vapor deposition method. The method for depositing mainly carbon by vapor phase decomposition is usually called CVD (Chemical Vapor Deposition), including thermal CVD and plasma CVD.

In the case where the first coating is formed by the deposition of carbon according to the vapor phase decomposition method, the so-called CVD method, there may be used as a decomposing gas a hydrocarbon, preferably a hydrocarbon having 1 to 6 carbon atoms, examples of which include methane, natural gas, propane, butane, benzene, and acetylene. Into these gases there may be incorporated inert gases such as $N_2$ Ar, He, Ne, Kr, Xe, and Rn, or hydrogen, for dilution purpose.

The feed rate of the decomposing gas is determined suitably according to the size or the structure of a furnace which is used for the reaction.

Changing at least one of thermal or mechanical properties of carbon in the first coating continuously or step-wise can be attained by changing at least one of conditions for the thermal decomposition such as, for example, temperature, pressure, feed rate of the thermal decomposing gas, and the feedstock dilution ratio, continuously or step-wise.

At the beginning of deposition of the first coating, a highly anisotropic carbon is allowed to be formed, and as the carbon deposition proceeds, the anisotropy of the deposited carbon is reduced continuously or step-wise so that at the end of the carbon deposition or thereabouts the carbon is low in anisotropy or is isotropic. The highly anisotropic carbon just referred to indicates a carbon having a thermal expansion coefficient in the "a" axis direction on the deposition plane of $-1 \times 10^{-6}$ to $2 \times 10^{-6}$ (1/° C.). The carbon low in anisotropy or isotropic also just referred to above indicates a carbon having a thermal expansion coefficient of $2.5 \times 10^{-6}$ to $5 \times 10^{-6}$ (1/° C.).

More specifically, for the production of the highly anisotropic carbon, the foregoing conditions for the vapor phase decomposition should be satisfied, and it is desirable that the temperature be usually in the range of 1,000° to 2,500° C., preferably 1,100° to 2,000° C., more preferably 1,100° to 1,600° C., and that the pressure be in the range of 0.1 to 760 mmHg, preferably 0.1 to 100 mmHg, more preferably 0.1 to 50 mmHg.

Lowering the anisotropy of the carbon produced continuously or step-wise can be done by using either a pressure increasing method or a temperature reducing method. Changing the two is suitable.

As to the conditions at the end of the carbon deposition, it is desirable that the pressure be not lower than the deposition start pressure and not higher than 760 mmHg, more preferably not lower than the deposition start pressure and not higher than 600 mmHg, and that the temperature be not lower than 800° C. and not higher than the deposition start temperature, more preferably not lower than 850° C. and not higher than the deposition start temperature. And it is necessary that at least one of increasing pressure and reducing temperature be conducted.

The thickness of the first coating is selected optionally according to purposes and is not specially limited, but preferably it is in the range of 0.1 μm to 5 mm.

The time required for the deposition is not specially limited, either. It may be selected suitably according to the coating thickness. But preferably it is in the range of 0.1 minute to 1,000 hours.

The second coating is formed on the first coating, using a ceramic material or both a ceramic material and carbon, by thermal decomposition in vapor phase. The method of depositing a ceramic material or both a ceramic material and carbon by vapor phase decomposition is usually CVD (Chemical Vapor Deposition), including thermal CVD and plasma CVD.

As examples of the ceramic material there are mentioned SiC, ZrC, TiC, HfC, $B_4C$, NbC, WC, $TiB_2$, BN, and $Si_3N_4$, with SiC, ZrC, TiC and HfC being particularly preferred. These ceramic material may be deposited simultaneously with carbon.

As the thermal decomposing gas for obtaining carbon there is used a hydrocarbon, preferably a hydrocarbon having 1 to 6 carbon atoms, examples of which include methane, natural gas, propane, and benzene. As the thermal decomposing gas for obtaining a ceramic material there is used a halide, a hydride, an organometallic compound, or a mixture thereof with any of the hydrocarbons just exemplified above, or with hydrogen or an inert gas. For example, there may be used $SiCl_4$ and $CH_3SiCl_3$ for SiC, $ZrCl_4$ for ZrC, $TiCl_4$ for TiC, and $HfCl_4$ for HfC.

Reaction conditions involve a temperature in the range of 8000° to 2,300° C., preferably 1,000° to 2,000° C., and a pressure in the range of 0.5 to 760 mmHg, preferably 50 to 760 mmHg.

The starting gas feed rate is determined suitably according to the size or the structure of a furnace which is used for the reaction.

The deposition may be continued until a predetermined thickness of the second coating is obtained. But preferably the time required for the deposition is in the range of 0.1 minute to 100 hours.

The carbon to ceramic ratio in the second coating is not specially limited, but usually it is 1:0.1-10 (weight ratio).

The thickness of the first coating and that of the second coating are determined suitably according to purposes and not specially limited, but are preferably in 1 the range of 0.1 μm to 5 mm.

EXAMPLES

The following examples are given to illustrate the present invention more concretely, but the invention is not limited thereto.

EXAMPLE 1

There was prepared a carbon/carbon composite using petroleum pitch as a matrix precursor and also using as a reinforcing fiber a three-dimensional orthogonal fabric obtained by using 2,000 pitch-based carbon fibers 10 microns in diameter in the direction of Z axis and 4,000 same fibers in the directions of X and Y axes. Then, a coating of carbon having a coefficient of thermal expansion in the plane direction of $0.5 \times 10^{-6}$ (/° C.) was formed on the surface of the carbon/carbon composite by thermal CVD, and as the outermost layer there was formed a coating of carbon having a thermal expansion coefficient of $4 \times 10^{-6}$ (/° C.), under continuous change in thermal expansion coefficient. The thus coated carbon/carbon composite was placed in a heating furnace, and SiC was deposited on the first coating by thermal CVD under the conditions of pressure 50 Torr, feed gas $SiCl_4 + CH_4 + H_2$ and temperature 1,400° C., to form a second coating.

The carbon/carbon composite thus coated was observed using a scanning electron microscope to find that carbon and SiC were deposited by CVD on the surface of the carbon/carbon composite.

Neither cracking nor delamination was observed at the interface of the carbon/carbon composite and the first coating, in the first coating, in the second coating, and at the interface of both coatings.

EXAMPLE 2

There was prepared a carbon/carbon composite using petroleum pitch as a matrix precursor and also using as a reinforcing fiber a three-dimensional orthogonal fabric obtained by using 2,000 pitch-based carbon fibers 10 microns in diameter in the direction of Z axis and 4,000 same fibers in the direction of X and Y axes. Then, a coating of carbon having a Young's modulus in the place direction of $27 \times 10^3$ kgf/mm$^2$ was formed on the surface of the carbon/carbon composite by thermal CVD, and as the outermost layer there was formed a coating of carbon having a Young's modulus of $1.1 \times 10^3$ kgf/mm$^2$, under continuous change in Young's modulus. The carbon/carbon composite thus coated was placed in a heating furnace, and SiC was deposited on the first coating by thermal CVD under the conditions of pressure 5 Torr, feed gas $CH_3SiCl_3 + H_2$, temperature 1,350° C., to form a second coating.

The carbon/carbon composite thus coated was observed using a scanning electron microscope to find that on the surface of the carbon/carbon composite there were uniform deposition of carbon and the deposition of SiC by CVD. Neither cracking nor delamination was observed at the interface of the carbon/carbon composite and the first coating, in the first coating, in the second coating, and at the interface of both coatings.

The carbon material obtained by the process of the present invention is superior in oxidation resistance and is difficult to get crack even under a heat load conditions, so a variety of uses can be expected.

What is claimed is:

1. A process for preparing a carbon material, comprising forming a first coating constituted mainly of carbon on the surface of a carbon/carbn compoiste, said composite having a carbon fiber content of 10 to 70 vol. %, by chemical vapor deposition, then forming on said first coating a second coating of a ceramic or a ceramic and carbon by chemical vapor deposition, and changing at least one of the following properties: thermal coefficient of expansion and Young's modulus in said first coating continuously or step-wise, said change effected by varying at least one of the following chemical vapor deposition conditions: temperature, pressure, thermal decomposing gas feed rate and feedstock dilution ration.

2. A process as set forth in claim 1, wherein said carbon/carbon composite is obtained by impregnating a pitch-based carbon fiber fabric with a carbonaceous pitch and then carbonizing said pitch.

3. A process as set forth in claim 1, wherein the thermal expansion coefficient of carbon in said first coating becomes larger continuously or step-wise from the carbon/carbon interface to the outermost layer of the first coating.

4. A process as set forth in claim 1, wherein said first coating is formed by a chemical vapor deposition using a hydrocarbon having 1 to 6 carbon atoms as a thermal decomposing gas.

5. A process as set forth in claim 1, wherein at the beginning of deposition of said first coating a highly anisotropic carbon is allowed to be formed, and as the carbon deposition proceeds, the anisotropy of the deposited carbon is reduced continuously or step-wise so that at the end of the carbon deposition or thereabouts the carbon is less anisotropic or is sotropic.

6. A process as set forth in claim 1, wherein said second coating is formed by a chemical vapor deposition using a mixed thermal decomposing gas comprising a hydrocarbon having 1 to 6 carbon atoms and a compound capable of forming by thermal decomposition a ceramic material selected from the group consisting of SiC, ZrC, TiC, HfC, B$_4$C, NbC, WC, TiB$_2$, BN and Si$_3$N$_4$.

* * * * *

UNITED STATES PATENT AND TRADEMARK OFFICE
CERTIFICATE OF CORRECTION

PATENT NO. : 5,093,156

DATED : March 3, 1992

INVENTOR(S) : Seiichi Uemura, et al.

It is certified that error appears in the above-identified patent and that said Letters Patent is hereby corrected as shown below:

Column 1, line 6: after "material" insert --having--

Column 1, line 8: "modules" should read as --modulus--

Column 1, line 20: "as base" should read as --as a base--

Column 1, line 29: delete "o"

Column 1, line 64: "0 vol" should read as --60 vol--

Column 2, line 12: "resins and" should read as --resins, and--

Column 2, line 30: "perform" should read as --preform--.

Column 2, line 41: "the 2,000° C." should read as --the carbonization under pressing may be performed at 400-2,000° C.--

Column 2, line 65: "coefficient," should read as --coefficient--

UNITED STATES PATENT AND TRADEMARK OFFICE
CERTIFICATE OF CORRECTION

PATENT NO. : 5,093,156
DATED : March 3, 1992
INVENTOR(S) : Seiichi Uemura, et al.

It is certified that error appears in the above-identified patent and that said Letters Patent is hereby corrected as shown below:

Column 3, line 52: "$N_2$" should read as --$N_2$,--

Column 4, lines 4 & 5: "10-6" should read as --$10^{-6}$--

Column 4, lines 7 & 8: "10-6" should read as --$10^{-6}$--

Column 4, line 26; "lower,than" should read as --lower than--

Column 4, line 63: "800°" should read as --800°--

Column 5, line 11: delete "1"

Column 6, line 19, Claim 1: "compoiste" should read as --composite--

Column 6, lines 29-30: "ration" should read as --ratio--

Signed and Sealed this

Fifth Day of October, 1993

*Attest:*

BRUCE LEHMAN

*Attesting Officer*     *Commissioner of Patents and Trademarks*